United States Patent
Lo et al.

(10) Patent No.: US 10,840,251 B2
(45) Date of Patent: Nov. 17, 2020

(54) MEMORY DEVICE AND MANUFACTURING METHOD

(71) Applicant: TAIWAN SEMICONDUCTOR MANUFACTURING CO., LTD., Hsinchu (TW)

(72) Inventors: Kuo-Hung Lo, Hsinchu (TW); Feng-Ming Chang, Hsinchu County (TW); Ying-Hsiu Kuo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/417,477

(22) Filed: May 20, 2019

(65) Prior Publication Data
US 2020/0135742 A1    Apr. 30, 2020

Related U.S. Application Data

(60) Provisional application No. 62/750,779, filed on Oct. 25, 2018.

(51) Int. Cl.
| | | |
|---|---|---|
| G11C 11/41 | (2006.01) | |
| H01L 27/11 | (2006.01) | |
| G11C 11/412 | (2006.01) | |
| G11C 11/419 | (2006.01) | |

(52) U.S. Cl.
CPC ........ *H01L 27/1104* (2013.01); *G11C 11/412* (2013.01); *G11C 11/419* (2013.01)

(58) Field of Classification Search
CPC ............................ G11C 11/412; G11C 11/419
USPC .......................................................... 365/145
See application file for complete search history.

(56) References Cited

U.S. PATENT DOCUMENTS

| | | |
|---|---|---|
| 8,675,418 B2 | 3/2014 | Wu et al. |
| 9,105,490 B2 | 8/2015 | Wang et al. |
| 9,117,500 B2 | 8/2015 | Wu et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,640,540 B1 * | 5/2017 | Liaw ............... G11C 11/419 |
| 9,831,183 B2 | 11/2017 | Lin et al. |
| 9,859,386 B2 | 1/2018 | Ho et al. |

(Continued)

*Primary Examiner* — Han Yang
(74) *Attorney, Agent, or Firm* — Maschoff Brennan

(57) ABSTRACT

A static random access memory device includes a write circuit, a read port circuit, and a substrate. The write port circuit includes a first inverter, a second inverter cross-coupled with the first inverter, a first pass-gate transistor coupled to the first inverter, and a second pass-gate transistor coupled to the second inverter. The read port circuit includes a read pull-down transistor and a read pass-gate transistor that are coupled in series to each other. The substrate includes a standard threshold voltage (STV) region and a low threshold voltage (LVT) region abutting the STV region. The write port circuit is formed within the STV region, and the read port circuit is formed within the LVT region. The LVT region has a first boundary at an edge of a gate of the first pass-gate transistor, or approaching the edge of the gate of the first pass-gate transistor.

20 Claims, 6 Drawing Sheets

(56) References Cited

U.S. PATENT DOCUMENTS

| | | | |
|---|---|---|---|
| 10,050,045 B1 * | 8/2018 | Hsu | ................... H01L 27/0924 |
| 2018/0138185 A1 | 5/2018 | Hsu et al. | |
| 2019/0006372 A1 | 1/2019 | Lu et al. | |

* cited by examiner

MEMORY DEVICE AND MANUFACTURING METHOD

PRIORITY CLAIM AND CROSS-REFERENCE

The present application claims priority to U.S. Provisional Application Ser. No. 62/750,779, filed Oct. 25, 2018, which is herein incorporated by reference.

BACKGROUND

A memory device includes transistors that are formed on a substrate. During the fabrication process, the threshold voltage of each transistor may have different values. Different regions for the transistors are defined by some semiconductor process and/or various threshold voltages of the transistors. For illustration, various threshold voltage regions are associated with the transistors which are arranged as, for example, the write port and the read port in the memory device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
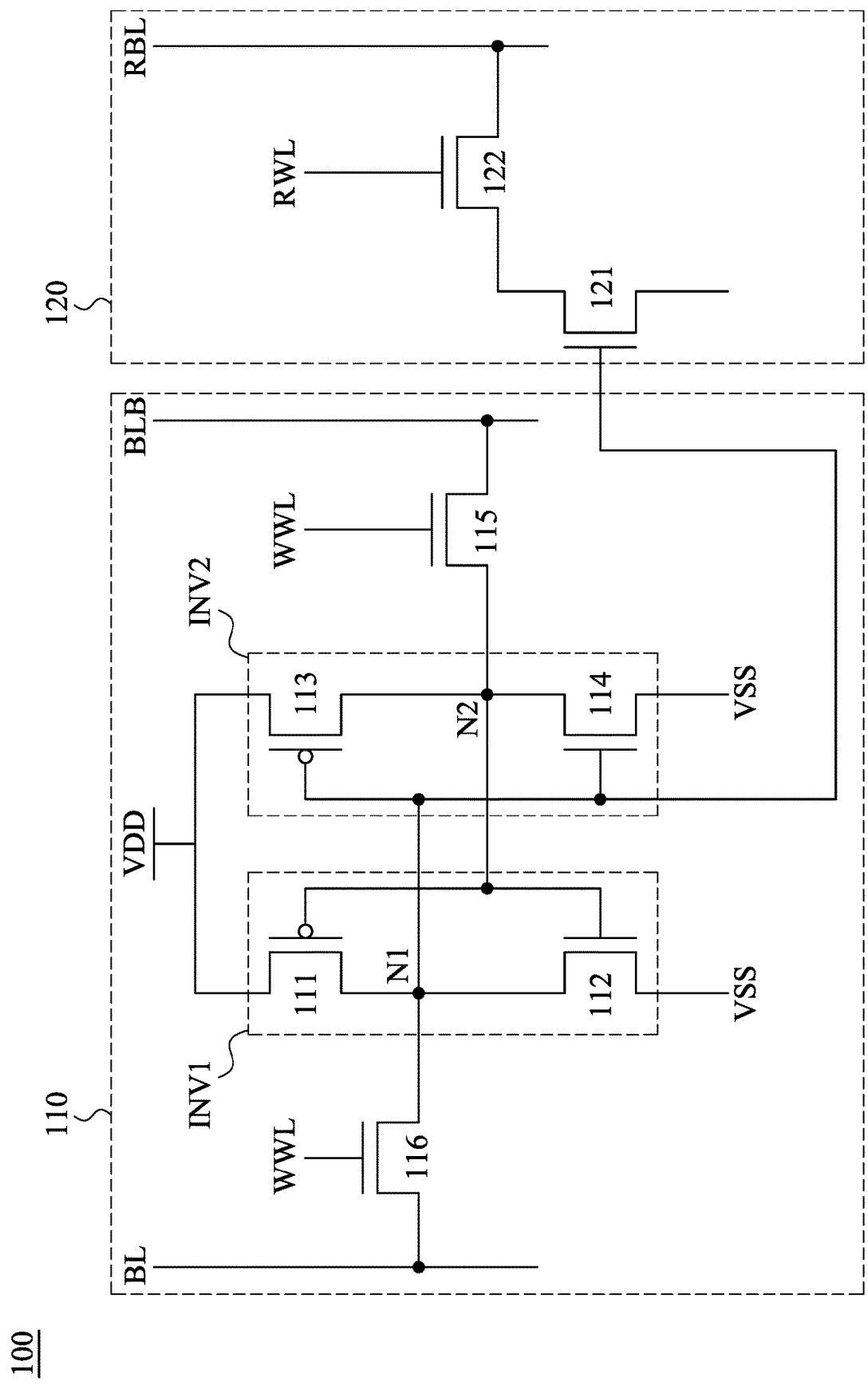
FIG. 1 is a circuit diagram of a static random access memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In this document, the term "coupled" may also be termed as "electrically coupled", and the term "connected" may be termed as "electrically connected". "Coupled" and "connected" may also be used to indicate that two or more elements cooperate or interact with each other.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference is now made to FIG. 1. FIG. 1 is a circuit diagram of a static random access memory (SRAM) device 100, in accordance with some embodiments of the present disclosure. In some embodiments, the SRAM device 100 is an eight transistors static random access memory (8T-SRAM) cell. In some embodiments, the SRAM device 100 includes a write port circuit 110 and a read port circuit 120. The write port 110 includes a first inverter INV1 and a second inverter INV2. The first inverter INV1 is formed by a first pull-up transistor 111 and a first pull-down transistor 112. The second inverter INV2 is formed by a second pull-up transistor 113 and a second pull-down transistor 114. Furthermore, both of the first inverter INV1 and second inverter INV2 are coupled between an operating voltage VDD (e.g., a power voltage) and a reference voltage VSS (e.g., a ground voltage). In some embodiments, the first pull-up transistor 111 and the second pull-up transistor 113 are p-type metal oxide semiconductor (PMOS) transistors, while the first pull-down transistor 112 and the second pull-down transistor 114 are n-type metal oxide semiconductor (NMOS) transistors, and the present disclosure is not limited in this respect.

For illustration in FIG. 1, the first inverter INV1 and the second inverter INV2 are cross-coupled with each other. Alternatively stated, the first inverter INV1 has an input coupled to the output of the second inverter INV2. Likewise, the second inverter INV2 has an input coupled to the output of the first inverter INV1. The output of the first inverter INV1 is referred to as a first storage node N1. Likewise, the output of the second inverter INV2 is referred to as a second storage node N2. In a normal operating mode, the first storage node N1 is in the opposite logic state as the second storage node N2. By employing the two cross-coupled inverters, the SRAM device 100 can hold the data using a latched structure so that the stored data will not be lost as long as power is supplied to provide the operating voltage VDD.

In some embodiments, the write port circuit 110 includes a first pass-gate transistor 115 connected between a bit line BLB and the output of the second inverter INV2. The write port circuit 110 further includes a second pass-gate transistor 116 connected between a bit line BL and the output of the first inverter INV1. The gates of the first pass-gate transistor 115 and the second pass-gate transistor 116 are connected to a word line WWL, which connects a row of memory cells (not shown) together in the SRAM device 100. For illustration, the word line WWL is provided for a write operation.

In operation, when the first pass-gate transistor 115 and the second pass-gate transistor 116 are inactive, the write port 110 maintains the complementary values at the first storage node N1 and the second storage node N2 as long as the operating voltage VDD is provided. This is so because each inverter of the pair of cross coupled inverters INV1 and INV2 drives the input of the other, thereby maintaining the voltages at the storage nodes N1 and N2. This operation will remain stable until the power is removed from the SRAM device 100, or, a write cycle is performed changing the stored data at the storage nodes N1 and N2.

In some embodiments, the read port circuit 120 includes a read pull-down transistor 121 and a read pass-gate transistor 122. For illustration, one terminal of the read pull-down transistor 121 is coupled to one terminal of the read pass-gate transistor 122. The gate of the read pull-down transistor 121 is coupled to the first storage node N1. A read word line RWL is coupled to the gate of the read pass-gate transistor 122 and provided for a read operation. For illustration of operation, the read pull-down transistor 121 is either turned on or off based on the voltage at the first storage node N1 that is coupled to the gate of the read pull-down transistor 121. When the read word line RWL has a positive voltage, the read pass-gate transistor 122 turns on and couples a read bit line RBL to the read pull-down transistor 121, and the read port circuit 120 therefore outputs a corresponding data bit on the read bit line RBL. In some situations, the SRAM device 100 may experience more read operations than write operations in the same time period. Accordingly, the data stored in the write port circuit 110 could be affected by the read operations, which is also referred to as "read disturbs." With the read port circuit 120 that is separate from the write port circuit 110, the read operations can be isolated from the write port circuit 110 by the read port circuit 120. As a result, the situations of "read disturbs" can be avoided.

The structure of the SRAM device 100 in FIG. 1 is described in the context of the 8T-SRAM. One of ordinary skill in the art, however, should understand that features of the various embodiments described herein may be used for forming other types of devices, such as a 10T-SRAM device, or memory devices other than SRAMs. Furthermore, embodiments of the present disclosure may be used as stand-alone memory devices, memory devices integrated with other integrated circuitry, or the like. Accordingly, the embodiments discussed herein are illustrative of specific ways to make and use the disclosure, and do not limit the scope of the disclosure. Alternatively stated, the configuration of the SRAM device 100 shown in FIG. 1 is given for illustrative purposes. Various configurations and connections are within the contemplated scope of the present disclosure.

Figure 2A:
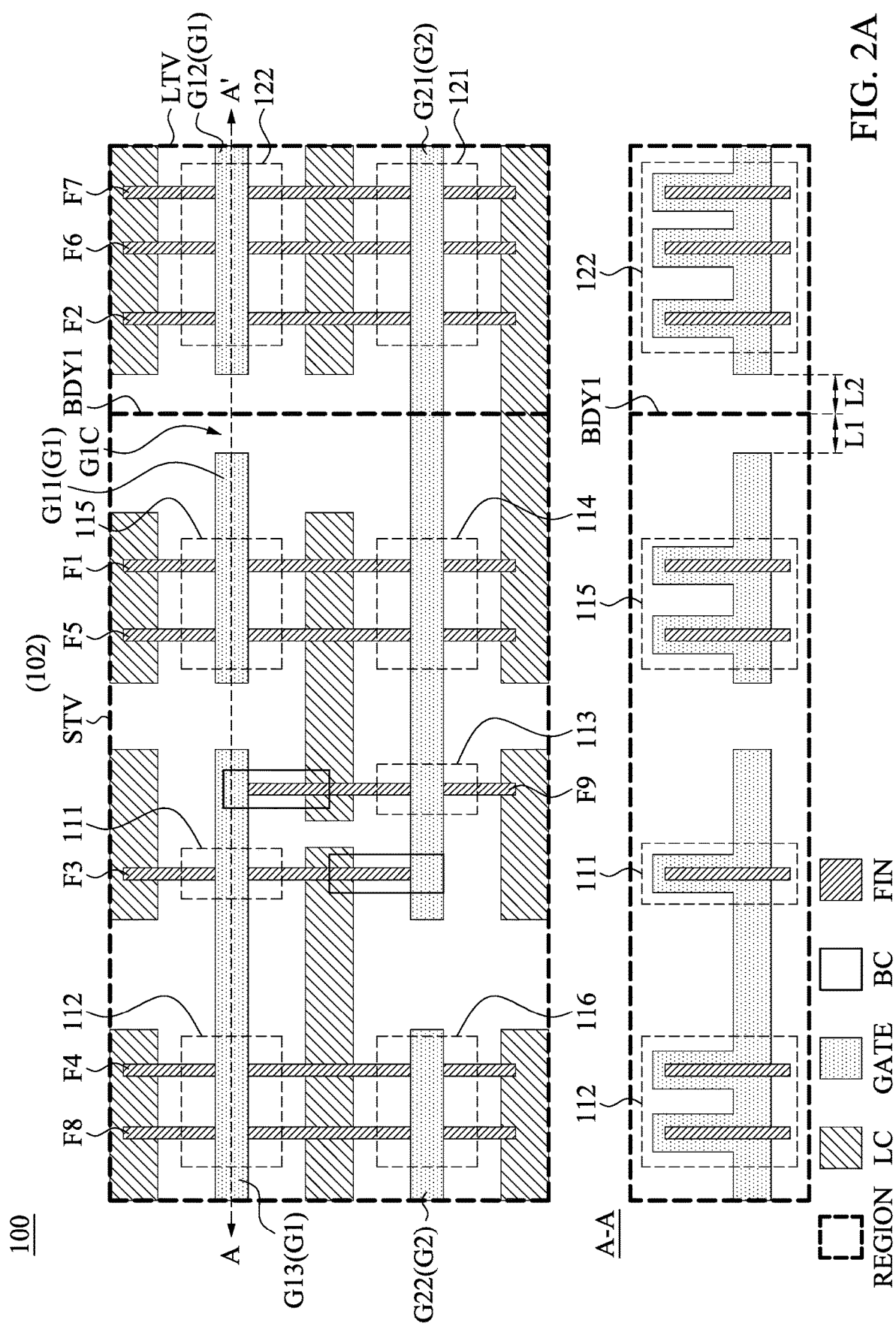
FIG. 2A is a schematic diagram illustrating the static random access memory device in FIG. 1 and a cross section view taken along a dash line AA', in accordance with some embodiments.

Reference is now made to FIG. 2A. FIG. 2A is a schematic diagram illustrating the SRAM device 100 in FIG. 1 and a cross section view taken along a dash line AA', according to some embodiments of the present disclosure. With respect to the embodiments of FIG. 1, like elements in FIG. 1 are designated with the same reference number, and some elements shown in FIG. 1 are omitted in FIG. 2A for ease of understanding.

As discussed above, the SRAM device 100 includes the first pass-gate transistor 115, the first pull-up transistor 111, the first pull-down transistor 112, and the read pass-gate transistor 122. In some embodiments, the first pass-gate transistor 115 includes a first portion (e.g., G11) of a first gate G1 and a first fin F1. The read pass-gate transistor 122 includes a second portion (e.g., G12) of the first gate G1 and a second fin F2. The first pull-up transistor 111 includes a third portion (e.g., G13) of the first gate G1 and a third fin F3. The first pull-down transistor 112 includes the third portion (e.g., G13) of the first gate G1 and a fourth fin F4.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

For illustration in FIG. 2A, the first portion G11 of the first gate G1, the second portion G12 of the first gate G1, and the third portion G13 of the first gate G1 are arranged separate and aligned to each other. In some embodiments, the first gate G1 is a metal gate. The first portion G11 of the first gate G1, the second portion G12 of the first gate G1, and the third portion G13 of the first gate G1 are integrally formed, for example, in one process. In some embodiments, the first portion G11 of the first gate G1 and the second portion G12 of the first gate G1 are formed by a cut metal gate (CMG) process after the first gate G1 is formed.

Furthermore, for illustration in FIG. 2A, the SRAM device 100 is arranged on a substrate 102. In some embodiments, the substrate 102 is a semiconductor substrate. The substrate 102 includes a standard threshold voltage region STV and a low threshold voltage region LTV abutting the standard threshold voltage region STV. Alternatively stated, a boundary of the standard threshold voltage region STV abutting the low threshold voltage region LTV is overlapped with a boundary of the low threshold voltage region LTV abutting the standard threshold voltage region STV. The first portion G11 of the first gate G1 and the third portion G13 of the first gate G1 are disposed within the standard threshold voltage region STV. The second portion G12 of the first gate G1 is disposed within the low threshold voltage region LTV. In some embodiments, threshold voltages of transistors in the standard threshold voltage region STV are higher than threshold voltages of transistors in the low threshold voltage region LTV. For example, the threshold voltage of the first pass-gate transistor 115 is higher than the threshold voltage of the read pass-gate transistor 122. For another example, a threshold voltage of the first pull-up transistor 111 is about 0.34 volt (V), and the threshold voltage of the read pass-gate voltage transistor 122 is in the range of about 0.24-0.27 V. The above threshold voltages of the transistors are given for illustrative purposes. Various threshold voltages of the transistors are within the contemplated scope of the present disclosure.

In some embodiments, the first pass-gate transistor 115, the read pass-gate transistor 122, and the first pull-down transistor 112 further include other fins. For illustration in FIG. 2A, the first pas-gate transistor 115 further includes a fifth fin F5, the read pass-gate transistor 122 further includes a sixth fin F6 and a seventh fin F7, and the first pull-down transistor 112 further includes an eighth fin F8.

In some embodiments, the SRAM device 100 includes the second pull-down transistor 114 including a first portion G21 of a second gate G2, the first fin F1, and the fifth fin F5, the read pull-down transistor 121 including the first portion G21 of the second gate G2, the second fin F2, the sixth fin F6, and the seventh fin F7, the second pull-up transistor 113 including the first portion G21 of the second gate G2 and a ninth fin F9, and the second pass-gate transistor 116 including a second portion G22 of the second gate G2, the fourth fin F4, and the eighth fin F8.

For illustration in FIG. 2A, the first portion G21 of the second gate G2 and the second portion G22 of the second gate G2 are arranged separate and aligned to each other. In some embodiments, the second gate G2 is a metal gate. The first portion G21 of the second gate G2 and the second portion G22 of the second gate G2 are integrally formed, for example, in one process. In some embodiments, the first portion G21 of the second gate G2 and the second portion G22 of the second gate G2 are formed by a cut metal gate process after the second gate G2 is formed.

Furthermore, for illustration in FIG. 2A, the first portion G21 of the second gate G2 is disposed extending form the standard threshold voltage region STV to the low threshold voltage region LTV. Alternatively stated, the first portion G21 of the second gate G2 crosses over a first boundary BDY1 where the standard threshold voltage region STV and the low threshold voltage region LTV abut each other. The second portion G22 of the second gate G2 is disposed within the standard threshold voltage region STV.

For illustration in FIG. 2A, the SRAM device 100 further includes a plurality of longer contacts LC and a plurality of butted contacts BC. The longer contacts LC and the butted contacts BC are configured to electrically couple the transistors each other. For example, the longer contacts LC and the butted contacts BC electrically couple the first pull-up transistor 111 and the first pull-down transistor 112 to the second pull-up transistor 113. For another example, the longer contacts LC and the butted contacts BC electrically couple the second pull-up transistor 113 and the second pull-down transistor 114 to the first pull-up transistor 111.

Reference is still made to FIG. 2A. FIG. 2A further includes a cross section view A-A taken along a dash line AA' shown in the SRAM device 100 of FIG. 2A. The cross section view A-A includes the first portion G11 of the first gate G1, the second portion G12 of the first gate G1, and the third portion G13 of the first gate G1. For illustration in FIG. 2A, the first boundary BDY1 between the standard threshold voltage region STV and the low threshold voltage region LTV is arranged between the first portion G11 of the first gate G1 and the second portion G12 of the first gate G1. A distance L1 is arranged between an edge of the first portion G11 of the first gate G1 and the first boundary BDY1. A distance L2 is arranged between an edge of the second portion of the first gate G12 and the first boundary BDY1. In some embodiments, the length of each one of the distance L1 and distance L2 ranges from about 10 nanometers (nm) to about 30 nm. The lengths of each one of the distance L1 and distance L2 are provided for illustrative purposes. Various lengths of distance L1 and distance L2 are within the contemplated scope of the present disclosure. For example, the range of the length of distance L1 and distance L2 is different from the range from about 10 nm to about 30 nm at a different technology node.

In some embodiments, the first boundary BDY1 is closer to the edge of the first portion G11 of the first gate G1 than the edge of the second portion G12 of the first gate G1. Alternatively stated, the distance L1 is smaller than the distance L2. In some embodiments, the distance L1 is substantially equal to or smaller than 30 nm. The distances above are given for illustrative purposes. Various distances are within the contemplated scope of the present disclosure.

Figure 2B:
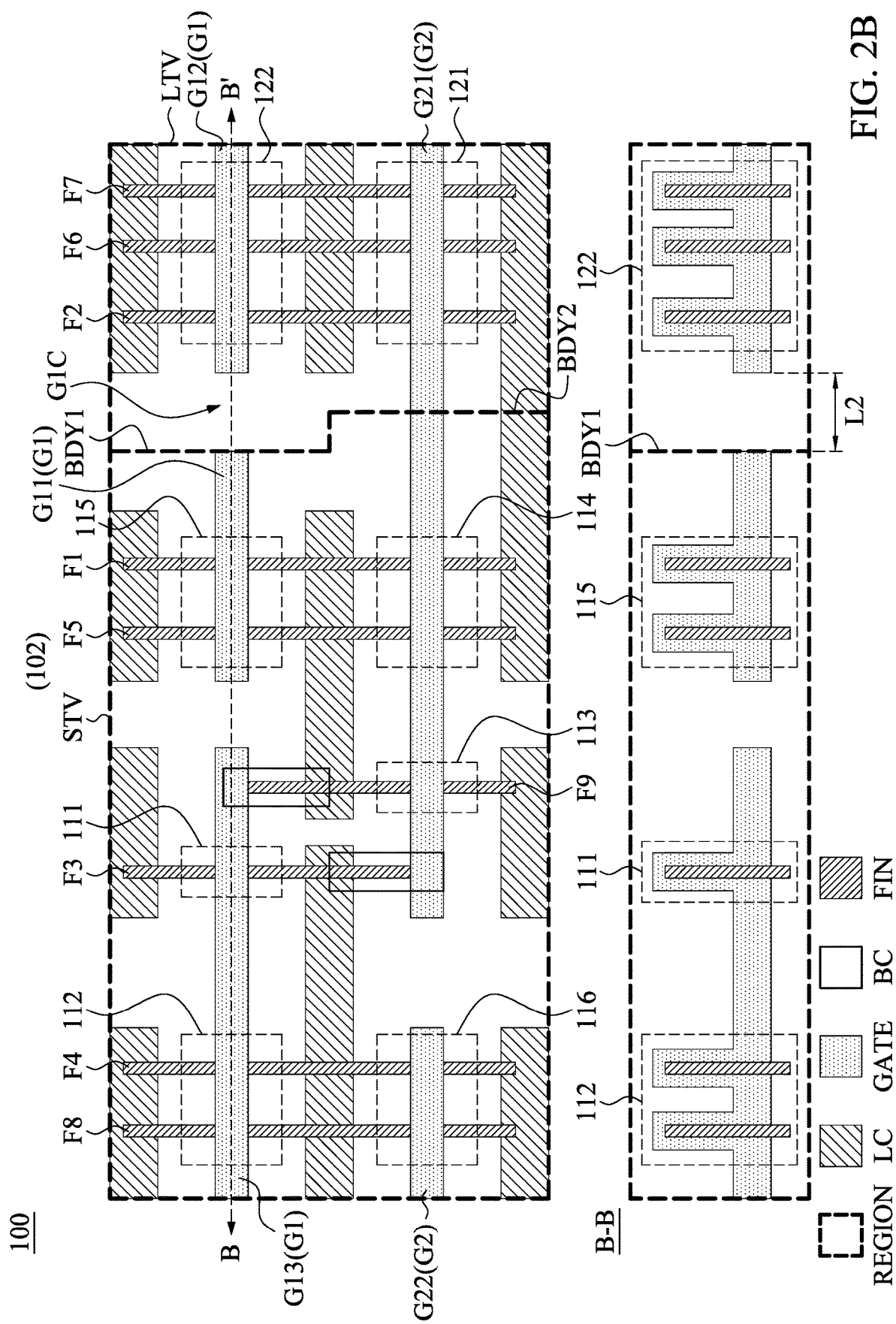
FIG. 2B a schematic diagram illustrating the static random access memory device in FIG. 1 and a cross section view taken along a dash line BB', in accordance with some embodiments.

Reference is now made to FIG. 2B. FIG. 2B is a schematic diagram illustrating the SRAM device 100 in FIG. 1 and a cross section view taken along a dash line BB', according to some embodiments of the present disclosure. With respect to the embodiments of FIGS. 1 and 2A, like elements in FIG. 2B are designated with the same reference number for ease of understanding.

In some embodiments, the boundary of the standard threshold voltage region STV abutting the low threshold voltage region LTV is arranged with a stepped shape. Alternatively stated, the boundary of the standard threshold voltage region STV abutting the low threshold voltage region LTV is able to be arranged into several parts. For illustration in FIG. 2B, the boundary of the standard threshold voltage region STV abutting the low threshold voltage region LTV is formed to include the first boundary BDY1 and a second boundary BDY2. The first boundary BDY1 is arranged at the edge of the first portion G11 of the first gate G1, and the second boundary BDY2 is arranged crossing the first portion G21 of the second gate G2. The distance L1 as discussed above is about zero in FIG. 2B.

In some embodiments, the first boundary BDY1 and the second boundary BDY2 are not aligned. In some other embodiments, the second boundary BDY2 is offset from the first boundary BDY1. Compared to the embodiments in FIG. 2A, the distance L1 decreases. Alternatively stated, the area of the standard threshold voltage region STV decreases, and the area of the low threshold voltage region LTV increases.

In some embodiments, the threshold voltage of the first pass-gate transistor 115 is associated with the first boundary BDY1. In other words, the threshold voltage of the first pass-gate transistor 115 is related to the distance L1. In some embodiments, the threshold voltage of the first pass-gate transistor 115 is increasing when the first boundary BDY1 approaches the edge of the first portion G11 of the first gate G1. For example, when the boundary of the low threshold voltage region LTV approaches the edge of the first portion G11 of the first gate G1 for about 20 nm, the threshold voltage of the first pass-gate transistor 115 increases about 0.02 V. The distance and the threshold voltage above are given for illustrative purposes. Various distances and threshold voltages are within the contemplated scope of the present disclosure.

In some further embodiments, the threshold voltage of the read pass-gate transistor 122 is associated with the first boundary BDY1. In other words, the threshold voltage of the read pass-gate transistor 122 is related to the distance L2. In some embodiments, the threshold voltage of the read pass-gate transistor 122 is decreasing when the first boundary BDY1 approaches the edge of the first portion G11 of the first gate G1. For example, when the boundary of the low threshold voltage region LTV approaches the edge of the first portion G11 of the first gate G1 for about 20 nm, the threshold voltage of the read pass-gate transistor 122 decreases about 0.02 V. The distance and the threshold voltage above are given for illustrative purposes. Various distances and threshold voltages are within the contemplated scope of the present disclosure.

Reference is still made to FIG. 2B. FIG. 2B further includes a cross section view B-B taken along a dash line BB' shown in the SRAM device 100 of FIG. 2B. The cross section view B-B includes the first portion G11 of the first gate G1, the second portion G12 of the first gate G1, and the third portion G13 of the first gate G1. For illustration in FIG. 2B, the first boundary BDY1 is arranged at the edge of the first portion G11 of the first gate G1. The distance L2 indicates a distance between the edge of the first portion G11 of the first gate G1 and the edge of the second portion G12 of the first gate G1.

Figure 2C:
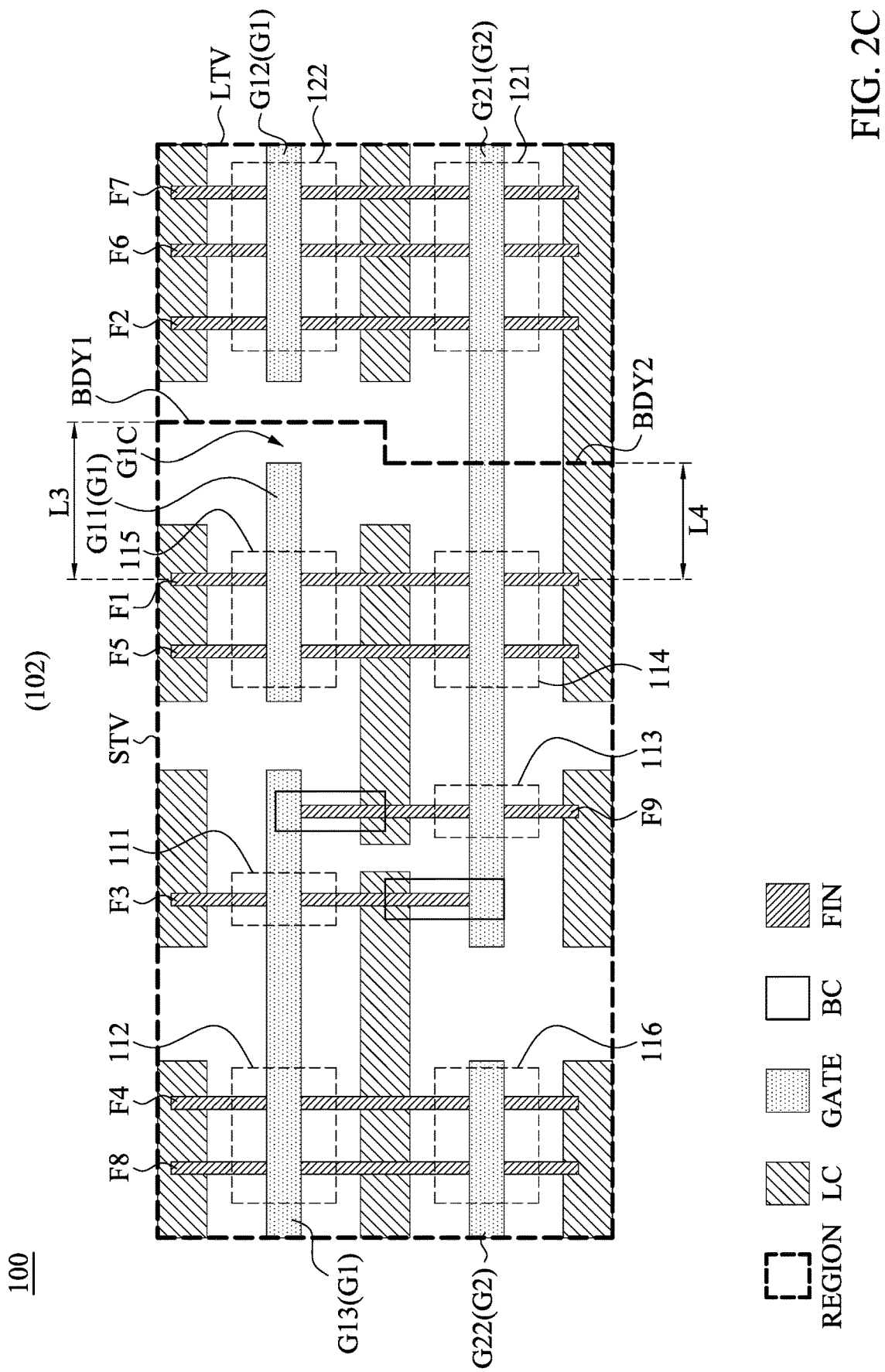
FIG. 2C a schematic diagram illustrating the static random access memory device in FIG. 1, in accordance with various embodiments.

Reference is now made to FIG. 2C. FIG. 2C is a schematic diagram illustrating the SRAM device 100 in FIG. 1, according to various embodiments of the present disclosure. With respect to the embodiments of FIGS. 1, 2A, and 2B, like elements in FIG. 2C are designated with the same reference number for ease of understanding.

For illustration in FIG. 2C, the boundary of the standard threshold voltage region STV abutting the low threshold voltage region LTV is arranged with a stepped shape. Alternatively stated, the boundary of the standard threshold voltage region STV abutting the low threshold voltage region LTV is able to be arranged into several parts. For illustration in FIG. 2C, the boundary of the standard threshold voltage region STV abutting the low threshold voltage region LTV is formed to include the first boundary BDY1 and a second boundary BDY2. The first boundary BDY1 is arranged between the first portion G11 of the first gate G1 and the second portion G12 of the first gate G1, and the second boundary BDY2 is arranged crossing the first portion G21 of the second gate G2.

Moreover, for illustration in FIG. 2C, a distance L4 between the first fin F1 and the boundary BDY2 is smaller than a distance L3 between the first fin F1 and the boundary BDY1. Compared to FIG. 2A, a threshold voltage of the second pull-down transistor 114 in FIG. 2C is higher than a threshold voltage of the second pull-down transistor 114 in FIG. 2A, and a threshold voltage of the read pull-down transistor 121 in FIG. 2C is lower than a threshold voltage of the read pull-down transistor 121 in FIG. 2A.

Figure 2D:
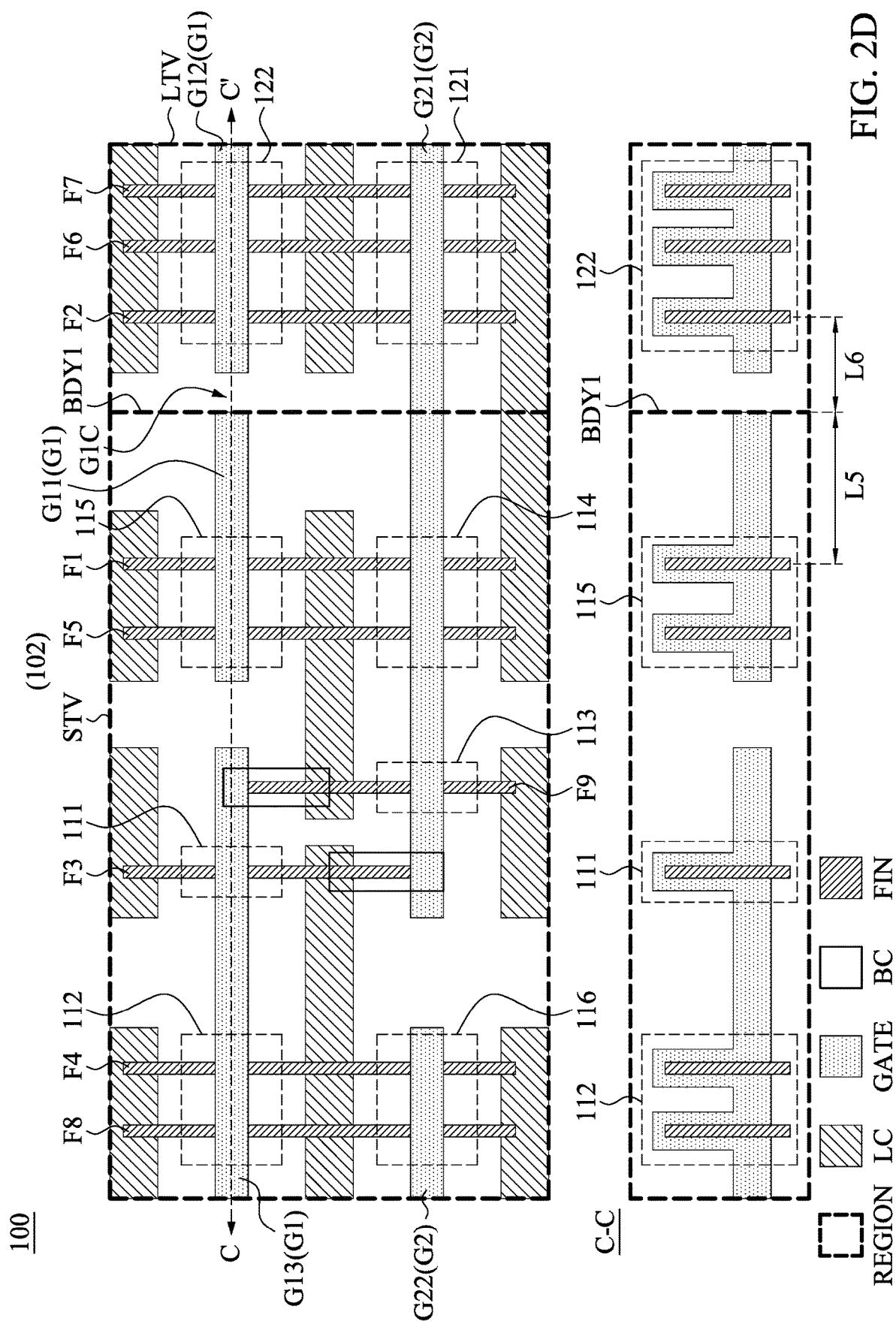
FIG. 2D a schematic diagram illustrating the static random access memory device in FIG. 1 and a cross section view taken along a dash line CC', in accordance with alternatively embodiments.

Reference is made to FIG. 2D. FIG. 2D is a schematic diagram illustrating the SRAM device in FIG. 1 and a cross section view taken along a dash line CC', according to alternative embodiments of the present disclosure. With respect to the embodiments of FIGS. 1, 2A, 2B, and 2C, like elements in FIG. 2D are designated with the same reference number for ease of understanding.

In some embodiments, the first portion G11 of the first gate G1 and the second portion G12 of the first gate G1 are formed by the cut metal gate process after the first gate G1 is formed. For illustration in FIG. 2D, the cut metal gate process is performed to form a cut G1C between the first portion G11 of the first gate G1 and the second portion G12 of the first gate G1 to separate the first portion G11 of the first gate G1 and the second portion G12 of the first gate G1. In some embodiments, a length of the cut G1C ranges from about 10 nm to about 30 nm. In FIG. 2D, the cut G1C is formed closer to the second fin F2 than to the first fin F1, and the cut G1C is formed within the low threshold voltage region LTV. The position of the cut is given for illustrative purposes. Various positions of the cut are within the contemplated scope of the present disclosure.

In some embodiments, the cut G1C is formed within the low threshold voltage region LTV, and the edge of the first portion G11 of the first gate G1 is abutted against the first boundary BDY1 of the low threshold voltage region LTV. In some other embodiments, after the cut metal gate process is performed, the edge of the first portion G11 of the first gate G1 is located within the standard threshold voltage region STV without abutting against the first boundary BDY1 of the low threshold voltage region LTV. Alternatively stated, the boundary BDY1 between the low threshold voltage region LTV and the standard threshold voltage region STV crosses the cut G1C.

Compared to the first portion G11 of the first gate G1 in FIG. 2A, the first portion G11 of the first gate G1 in FIG. 2D is longer than the first portion G11 of the first gate G1 in FIG. 2A because of the different positions of the cut G1C. In some embodiments, compared to the first portion G11 of the first gate G1 in FIG. 2A, the first portion G11 of the first gate G1 in FIG. 2D is longer than the first portion of the first gate G11 in FIG. 2A by a length in the range of about 0-20 nm. In some embodiments, the threshold voltage of the first pass-gate transistor 115 is increasing when the cut G1C is formed approaching the second fin F2. In some embodiments, the threshold voltage of the first pass-gate transistor 115 is increasing when the edge of the first portion G11 of the first gate G1 approaches the second fin F2.

Compared to the second portion G12 of the first gate G1 in FIG. 2A, the second portion G12 of the first gate G1 in FIG. 2D is shorter than the second portion G12 of the first gate G1 in FIG. 2A because of the different positions of the cut G1C. In some embodiments, the threshold voltage of the read pass-gate transistor 122 is decreasing when the cut G1C is formed approaching the second fin F2. In some embodiments, the threshold voltage of the read pass-gate transistor 122 is decreasing when the edge of the first portion G11 of the first gate G1 approaches the second fin F2.

Reference is still made to FIG. 2D. FIG. 2D further includes a cross section view C-C taken along a dash line CC' shown in the SRAM device 100 of FIG. 2D. The cross section view C-C includes the first portion G11 of the first gate G1, the second portion G12 of the first gate G1, and the third portion G13 of the first gate G1. For illustration in FIG. 2D, the first boundary BDY1 is arranged at the edge of the first portion G11 of the first gate G1. A distance L5 indicates a distance between the edge of the first portion G11 of the first gate G1 and the first fin F1, and a distance L6 indicates a distance between the edge of the first portion G11 of the first gate G1 and the second fin F2. In some embodiments, the distance L5 is longer than the distance L6. Alternatively stated, the cut G1C formed by the cut metal gate process approaches the second fin F2.

The above arrangements of the SRAM device 100 shown in FIGS. 2A-2D are given for illustrative purposes. Various arrangements of the SRAM device 100 are within the contemplated scope of the present disclosure.

Figure 3:
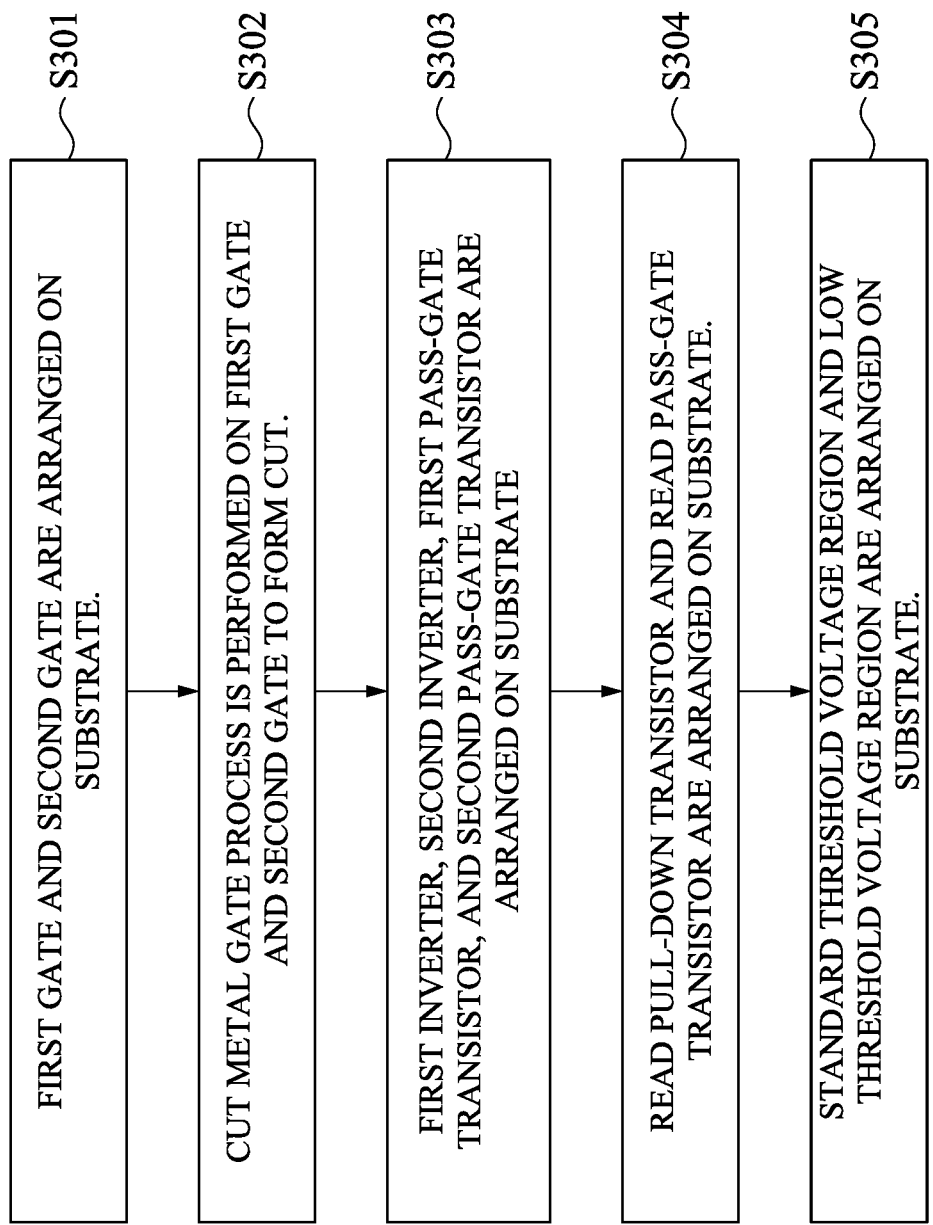
FIG. 3 is a flow chart of a method to manufacture the static random access memory device in FIGS. 1 and 2A, in accordance with some embodiments.

Reference is now made to FIG. 3. FIG. 3 is a flow chart of a method 300 to manufacture the SRAM device 100 in FIGS. 1 and 2A, in accordance with some embodiments of the present disclosure. In some embodiments, the method 300 includes operations S301-S305. In operation S301, for illustration of FIGS. 1 and 2A, the first gate G1 and the second gate G2 are arranged on the substrate 102. The first gate G1 and the second gate G2 are separate from each other and arranged in parallel to each other.

In operation S302, for illustration of FIGS. 1 and 2A, the cut metal gate process is performed on the first gate G1 and the second gate G2 to form the cut G1C. The cut metal gate process is performed to form the first portion G11 of the first gate G1, the second portion G12 of the first gate G1, and the third portion G13 of the first gate G1. The first portion G11 of the first gate G1 and the second portion G12 of the first gate G1 are separate by the cut G1C. The cut metal gate process is further performed to form the first portion G21 of the second gate G2 and the second portion G22 of the second gate G2. The first portion G21 of the second gate G2 and the second portion G22 of the second gate G2 are parallel and separate to each other.

In some embodiments, for example, the embodiments shown in FIG. 2D, the cut G1C formed by the cut metal gate process is formed approaching the second fin F2. Therefore, the distance between the edge of the first portion G11 of the first gate G1 and the second fin F2 decreases, and the first portion G11 of the first gate G1 extends toward the second fin F2.

In operation S303, the first inverter INV1, the second inverter INV2, the first pass-gate transistor 115, and the second pass-gate transistor 116 are arranged on the substrate 102. The first pass-gate 115 is arranged with the first portion G11 of the first gate G1. The first inverter INV1 is arranged with the third portion G13 of the first gate G1. The first inverter INV1 includes the first pull-up transistor 111 and the first pull-down transistor 112. Therefore, the first pull-up transistor 111 and the first pull-down transistor 112 are arranged with the third portion G13 of the first gate G1. The second pass-gate 116 is arranged with the second portion G22 of the second gate G2. The second inverter INV2 is arranged with the first portion G21 of the second gate G2. The second inverter INV2 includes the second pull-up transistor 113 and the second pull-down transistor 114. Therefore, the second pull-up transistor 113 and the second pull-down transistor 114 are arranged with the first portion G21 of the second gate G2.

The first pull-up transistor 111 is arranged to couple the first portion G21 of the second gate G2 via the fin F3 and the butted contact BC. The first pull-down transistor 112 is arranged to share the fin F4 and the fin F8 with the second pass-gate transistor 116. The first pass-gate transistor 115 is arranged to share the fin F1 and the fin F5 with the second pull-down transistor 114. The second pull-up transistor 113 is arranged to couple the third portion G13 of the first gate G1 via the fin F9 and the butted contact BC.

In operation S304, for illustration of FIGS. 1 and 2A, the read pull-down transistor 121 and the read pass-gate transistor 122 are arranged on the substrate 102. The read pull-down transistor 121 is arranged with the first portion G21 of the second gate G2. The read pass-gate transistor 122 is arranged with the second portion G12 of the first gate G1. The read pass-gate transistor 122 is arranged to share the fin F2, the fin F6, and the fin F7 with the read pull-down transistor 121.

In operation S305, for illustration of FIGS. 1 and 2A, the standard threshold voltage region STV and the low threshold voltage region LTV are arranged on the substrate 102. The standard threshold voltage region STV is arranged abutting the low threshold voltage region LTV. In some embodiments, arranging the standard threshold voltage region STV is performed by depositing a first layer on the standard threshold voltage region STV, and arranging the low threshold voltage region LTV is performed by depositing a second layer on the low threshold voltage region LTV. The first layer is different form the second layer.

For illustration of FIGS. 1 and 2A, the first boundary BDY1 is disposed between the edge of the first portion G12 of the first gate G1 and the edge of the second portion G12 of the first gate G1. After the operation S305, the distance L1 and the distance L2 are defined. In some embodiments, the first boundary BDY1 is closer to the edge of the first portion G11 of the first gate G1. Alternatively stated, the distance L1 is smaller than the distance L2.

In some other embodiments, for example, the embodiments shown in FIG. 2B, the boundary of the low threshold voltage region LTV abutting the standard threshold voltage region STV is arranged approaching the edge of the first portion G11 of the first gate G1. Therefore, the threshold voltage of the first pass-gate transistor 115 increases and is substantially equal to the threshold voltage of the first pull-up transistor 111, and the threshold voltage of the read pass-gate transistor 122 decreases. In some alternative embodiments, the threshold voltage of the first pass-gate transistor 115 approaches the threshold voltage of the first pull-up transistor 111. Alternatively stated, the threshold voltage of the first pass-gate transistor 115 is balanced with the threshold of the first pull-up transistor 111.

In some embodiments, for example, the embodiment shown in FIG. 2D, when the cut G1C between the first portion G11 of the first gate G1 and the second portion G12 of the first gate G1 is formed approaching the second fin F2, the threshold voltage of the first pass-gate transistor 115 increases, and the threshold voltage of the read pass-gate transistor 122 decreases. Therefore, in some embodiments, the threshold voltage of the first pass-gate transistor 115 approaches the threshold voltage of the first pull-up transistor 111. In some other embodiments, the threshold voltage of the first pass-gate transistor 115 is substantially equal to the threshold voltage of the first pull-up transistor 111. Alternatively stated, the threshold voltage of the first pass-gate transistor 115 is balanced with the threshold voltage of the first pull-up transistor 111.

In some embodiments, the first layer and the second layer are conductive. A work function of the first layer and a work function of the second layer are different. In some embodiments, the first layer is deposited by several materials with several thicknesses, and the second layer is deposited by other several materials with other several thicknesses.

The operation S305 further includes removing part of the first layer and part of the second layer. In some embodiments, after removing the part of the first layer and the part of the second layer, the remaining of the first layer is located above the first gate G1 and the second gate G2 within the standard threshold voltage region STV, and the remaining of the second layer is located above the first gate G1 and the second gate G2 within the low threshold voltage region LTV.

In some approaches, the threshold voltage of the first pass-gate transistor 115 is lower than the threshold voltage of the first pull-up transistor 111. Alternatively stated, the threshold voltage of the first pass-gate transistor 115 in the write port circuit 110 is un-balanced. In some embodiments, the un-balanced threshold voltage causes the write operation (for example, write 1 and/or write 0 operations) of write port circuit 110 un-balanced. Therefore, the efficiency of the SRAM device in the write port circuit 110 decreases due to the un-balanced threshold voltage within the write port circuit 110.

Compared to the above approaches, the threshold voltage of the first pass-gate transistor 115 approaches the threshold voltage of the first pull-up transistor 111, and/or the threshold voltage of the first pass-gate transistor 115 is substantially equal to the threshold voltage of the first pull-up transistor 111. The effect caused by the un-balanced threshold voltage is alleviated. The un-balanced threshold voltage is able to be decreased by changing the position where performed the cut metal gate process, by changing the arrangement of the standard threshold voltage region STV and the low threshold voltage region LTV, or the combination thereof. Therefore, the unbalanced write operations of the write port circuit 110 are improved.

The above illustrations include exemplary operations, but the operations are not necessarily performed in the order shown. Operations may be added, replaced, changed order, and/or eliminated as appropriate, in accordance with the spirit and scope of various embodiments of the present disclosure. For example, the operation S303 and operation S304 are performed together. For another example the operations S303 and S304 are performed before the operation S302.

In some embodiments, a static random access memory device is disclosed that includes a write circuit, a read port circuit, and a substrate. The write port circuit includes a first inverter, a second inverter cross-coupled with the first inverter, a first pass-gate transistor coupled to an output of the first inverter, and a second pass-gate transistor coupled to an output of the second inverter. The read port circuit includes a read pull-down transistor and a read pass-gate transistor that are coupled in series to each other. The substrate includes a standard threshold voltage (STV) region and a low threshold voltage (LVT) region abutting the standard threshold voltage region. The write port circuit is formed within the STV region of the substrate, and the read port circuit is formed within the LVT region of the substrate. The LVT region of the substrate has a first boundary at an edge of a gate of the first pass-gate transistor, or approaching the edge of the gate of the first pass-gate transistor.

Also disclosed is the static random access memory device that includes a first inverter, a second inverter, a first pass-gate transistor, a second pass-gate transistor, a read pass-gate transistor, a read pull-down transistor, and a substrate. The second inverter is cross-coupled to the first inverter. The read pass-gate transistor includes a second portion of the first gate, and the first portion of the first gate and the second portion of the first gate are separate. The substrate includes a standard threshold voltage region and a low threshold voltage region abutting the standard threshold voltage region. The first inverter, the second inverter, the first pass-gate transistor, and the second pass-gate transistor are formed within the standard threshold voltage region, and the read-pass-gate transistor and the read pull-down transistor are formed within the low threshold voltage region. A distance between the first portion of the first gate and the low threshold voltage region is smaller than a distance between the second portion of the first gate and the standard threshold voltage region.

Also disclosed is the method that includes arranging a first gate, and etching the first gate to form a cut. The first gate is arranged extending from being disposed in a standard threshold voltage region of a substrate to being disposed in a low threshold voltage region of the substrate, and extending across a first fin structure in the standard threshold voltage region and a second fin structure in the low threshold voltage region. The first gate is etched to form a cut, and the first gate is separated into a first gate portion and a second gate portion by the cut. The first gate portion is arranged, within the standard threshold voltage region, as a gate of a first pass-gate transistor in a write port circuit of a static random access memory device, and the second gate portion is arranged, within the low threshold voltage region, as a gate of a read pass-gate transistor in a read port circuit of the SRAM device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A static random access memory (SRAM) device, comprising:
    a write port circuit comprising a first inverter, a second inverter cross-coupled with the first inverter, a first pass-gate transistor coupled to an output of the first inverter, and a second pass-gate transistor coupled to an output of the second inverter;
    a read port circuit comprising a read pull-down transistor and a read pass-gate transistor that are coupled in series to each other; and
    a substrate comprising a standard threshold voltage (SVT) region and a low threshold voltage (LVT) region abutting the standard threshold voltage region, wherein the write port circuit is formed within the standard threshold voltage region of the substrate, and the read port circuit is formed within the low threshold voltage region of the substrate,
    wherein the low threshold voltage region of the substrate has a first boundary, wherein a gate of the first pass-gate transistor is closer to the first boundary than a gate of the read pass-gate transistor.

2. The SRAM device of claim 1, wherein the low threshold voltage region of the substrate has a second boundary that is not aligned with the first boundary of the low threshold voltage region.

3. The SRAM device of claim 2, wherein a first pull-up transistor and a first pull-down transistor in the first inverter and the read pull-down transistor share a continuous gate, and the continuous gate crosses the second boundary of the low threshold voltage region.

4. The SRAM device of claim 1, wherein a threshold voltage of the first pass-gate transistor is substantially equal to a threshold voltage of a first pull-up transistor in the first inverter.

5. The SRAM device of claim 1, wherein a threshold voltage of the read pass-gate transistor is lower than a threshold voltage of the first pass-gate transistor.

6. The SRAM device of claim 1, wherein the first boundary of the low threshold voltage region of the substrate at least overlaps a first boundary of the standard threshold voltage region of the substrate at an edge of the gate of the first pass-gate transistor.

7. The SRAM device of claim 6, wherein the low threshold voltage region of the substrate has a second boundary that overlaps a second boundary of the standard threshold voltage region of the substrate and is offset from the first boundary of the low threshold voltage region.

8. The SRAM device of claim 7, wherein the first inverter comprises a first pull-down transistor, the first pull-down transistor and the read pull-down transistor include a continuous gate crossing the second boundary of the low threshold voltage region.

9. A static random access memory (SRAM) device, comprising:
   a first inverter;
   a second inverter cross-coupled to the first inverter;
   a first pass-gate transistor including a first portion of a first gate;
   a second pass-gate transistor;
   a read pass-gate transistor including a second portion of the first gate, wherein the first portion of the first gate and the second portion of the first gate are separate from each other;
   a read pull-down transistor; and
   a substrate comprising a standard threshold voltage (SVT) region and a low threshold voltage (LVT) region abutting the standard threshold voltage region, wherein the first inverter, the second inverter, the first pass-gate transistor, and the second pass-gate transistor are formed within the standard threshold voltage region, and the read pass-gate transistor and the read pull-down transistor are formed within the low threshold voltage region,
   wherein a distance between the first portion of the first gate and the low threshold voltage region is smaller than a distance between the second portion of the first gate and the standard threshold voltage region.

10. The SRAM device of claim 9, wherein the low threshold voltage region has a first boundary and a second boundary, wherein the second boundary crosses a second gate, wherein the second gate is continuous and is shared by the second pass-gate transistor and the read pull-down transistor.

11. The SRAM device of claim 10, wherein the first boundary is arranged at an edge of the first portion of the first gate.

12. The SRAM device of claim 10, wherein the first boundary and the second boundary are arranged in a stepped shape.

13. The SRAM device of claim 9, wherein a threshold voltage of the first pass-gate transistor is higher than a threshold voltage of the read pass-gate transistor.

14. The SRAM device of claim 9, wherein the second inverter comprises a pull-up transistor and a pull-down transistor shared a third portion of the first gate with the pull-up transistor, wherein a threshold voltage of the first pass-gate transistor is substantially equal to a threshold voltage of the pull-up transistor.

15. The SRAM device of claim 14, wherein the first portion of the first gate, the second portion of the first gate, and the third portion of the first gate are integrally formed on the substrate.

16. A method, comprising:
   arranging a first gate extending from being disposed in a standard threshold voltage (SVT) region of a substrate to being disposed in a low threshold voltage (LVT) region of the substrate, and extending across a first fin structure in the standard threshold voltage region and a second fin structure in the low threshold voltage region; and
   etching the first gate to form a cut, wherein the first gate is separated into a first gate portion and a second gate portion by the cut, the first gate portion is arranged, within the standard threshold voltage region, as a gate of a first pass-gate transistor in a write port circuit of a static random access memory (SRAM) device, and the second gate portion is arranged, within the low threshold voltage region, as a gate of a read pass-gate transistor in a read port circuit of the SRAM device,
   wherein the cut is formed closer to the second fin structure than to the first fin structure,
   wherein a distance between a first portion of the first gate and the low threshold voltage region and a distance between a second portion of the first gate and the standard threshold voltage region are different from each other.

17. The method of claim 16, wherein the etching is performed by a cut metal gate (CMG) process.

18. The method of claim 16, wherein a boundary of the low threshold voltage region of the substrate overlaps a boundary of the standard threshold voltage region of the substrate at an edge of the cut.

19. The method of claim 16, wherein etching the first gate to form the cut comprises:
   etching a portion of the first gate which is disposed in the low threshold voltage region of the substrate, to form the cut in the low threshold voltage region of the substrate.

20. The method of claim 16, wherein a threshold voltage of the first pass-gate transistor is higher than a threshold voltage of the read pass-gate transistor.

* * * * *